United States Patent [19]

Jun

[11] Patent Number: 5,346,847
[45] Date of Patent: Sep. 13, 1994

[54] METHOD FOR FABRICATING A SEMICONDUCTOR MEMORY DEVICE HAVING STORAGE NODE OVERLAP WITH BIT LINE

[75] Inventor: Young K. Jun, Seoul, Rep. of Korea

[73] Assignee: Gold Star Electron Co., Ltd., Rep. of Korea

[21] Appl. No.: 131,707

[22] Filed: Oct. 5, 1993

Related U.S. Application Data

[62] Division of Ser. No. 850,676, Mar. 13, 1992, Pat. No. 5,270,561.

[30] Foreign Application Priority Data

Mar. 15, 1991 [KR] Rep. of Korea ............... 4137/1991
Mar. 15, 1991 [KR] Rep. of Korea ............... 4139/1991

[51] Int. Cl.⁵ ................... H01L 21/70; H01L 27/00
[52] U.S. Cl. ...................................... 437/52; 437/60; 437/919
[58] Field of Search ............... 437/52, 919, 48, 60

[56] References Cited

U.S. PATENT DOCUMENTS

| | | |
|---|---|---|
| 4,864,375 | 9/1989 | Teng et al. |
| 5,111,275 | 5/1992 | Sawada et al. |
| 5,219,780 | 6/1993 | Jun ........................ 437/52 |
| 5,229,314 | 7/1993 | Okudaiva et al. ........... 437/52 |

Primary Examiner—Olik Chaudhuri
Assistant Examiner—H. Jey Tsai
Attorney, Agent, or Firm—Faegre & Benson

[57] ABSTRACT

The invention relates to a semiconductor memory device in which a bit line ring which functions as a bit line is formed at the upper and lower stage of the bit line and a storage node is formed to be overlapped in the same direction with said bit line formed perpendicularly to a word line to improve the integration degree.

Therefore, a capacitor area can be increased without an increase of an area of the unit cell to improve the integration degree of a semiconductor memory device and the generation of the bent portion of the active region can be avoided to decrease the distortion.

6 Claims, 14 Drawing Sheets

METHOD FOR FABRICATING A SEMICONDUCTOR MEMORY DEVICE HAVING STORAGE NODE OVERLAP WITH BIT LINE

This is a divisional of copending application(s) Ser. No. 07/850,676 filed on Mar. 13, 1992, U.S. Pat. No. 5,270,561.

BACKGROUND OF THE INVENTION

The present invention relates to a semiconductor memory device and a method for fabrication thereof, in which a bit line and a storage node are overlapped to improve the integration degree.

FIG. 1(a) through (d) show cross-sectional views of a device at various stages of a fabrication process according to the prior art.

Figure 1A:
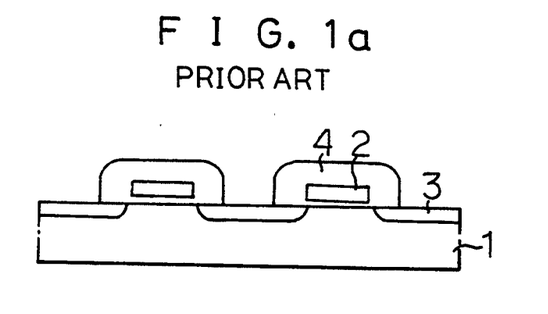
FIGS. 1(a) through (d) are process diagrams for fabricating a semiconductor memory device according to the prior art.

First, as shown in FIG. 1(a), a gate 2, a source and drain region 3 and an oxide film 4 are successively formed on a semiconductor substrate 1.

Figure 1B:
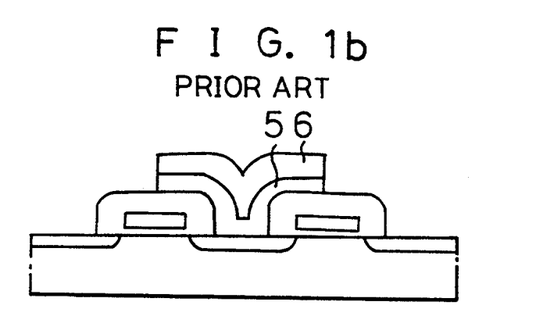

As shown in FIG. 1(b), a bit line contact is formed and a bit line 5 which is either a refractory metal or a silicide and an oxide film 6 are deposited and then patterned to restrict the fixed portion.

Figure 1C:
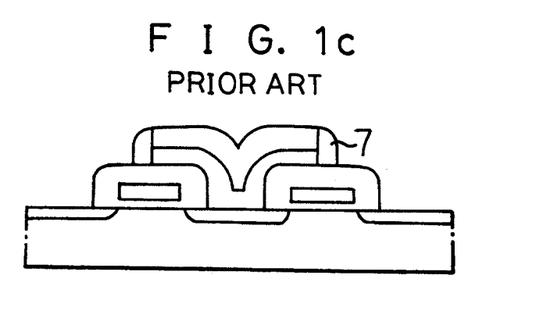

As shown in FIG. 1(c), a side wall 7 of the oxide film is formed at both sides of the oxide film 6 and the bit line 5.

Figure 1D:
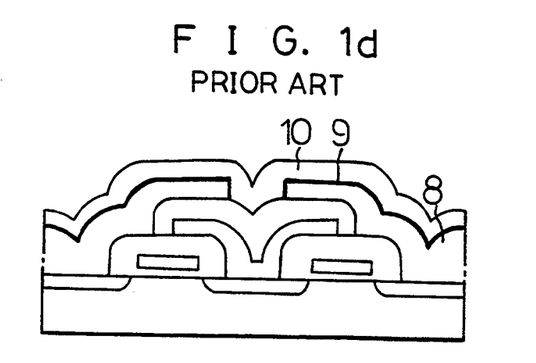

As shown in FIG. 1(d), a capacitor consisting of a storage node 8, a dielectric film 9 and a plate 10 is formed, thereby completing fabrication of the prior semiconductor memory device.

Figure 2:
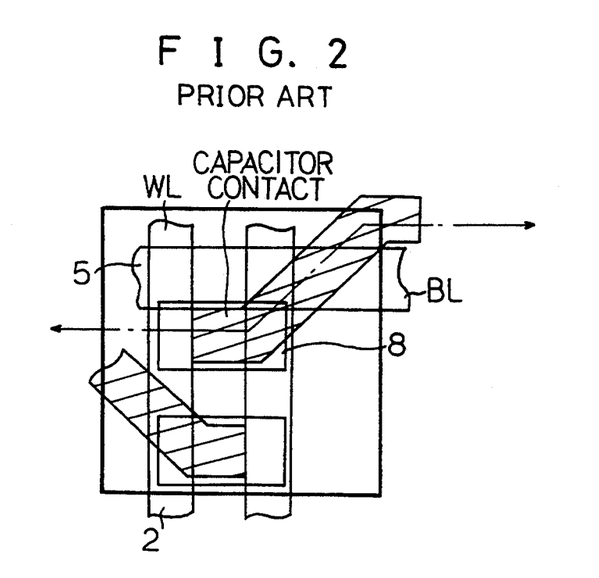
FIG. 2 is a lay-out of a semiconductor memory device of FIG. 1.

However, in semiconductor memory devices fabricated by aforesaid conventional method, as shown in FIG. 2, bit line 5 and storage node 8 are separated in the three dimensions and the active region(AR) is diagonally aligned against the word line 2 and the bit line 5. Therefore, the area of a unit cell is increased and distortion is caused by the bent portion of the active region(AR) generated in processing.

SUMMARY OF THE INVENTION

The present invention provides a semiconductor memory device and method for fabrication thereof, in which an active region is aligned against a bit line in the same direction and a bit line and a storage node are overlapped to improve the integration degree.

To obtain the above object, there is provided a semiconductor memory device in which a bit line is formed perpendicularly to a word line and a storage node is formed in the same direction of the bit line ring which functions as a bit line to be overlapped with said bit line.

Furthermore, the present invention provides a method for fabrication of a semiconductor memory device comprising the steps of successively forming a field oxide for isolating the devices, a gate, a source and drain region and a first oxide film which covers said gate on a semiconductor substrate;

filling a doped polysilicon film in the buried contact region;

forming a second oxide film at portion which is removed from a bit line contact region;

filling a second doped polysilicon film in said bit line contact region;

forming a bit line in said bit line contact region;

forming an insulating film for leveling the surface within the width of bit line;

forming a side wall of the same material as said bit line at the sides of said bit line and said insulating film for leveling the surface;

depositing a third oxide film on the whole surface;

removing said second and said third oxide films in the buried contact region; and forming a capacitor consisting of a storage node, a dielectric film and a plate.

Furthermore, the present invention provides a method for fabrication of a semiconductor memory device comprising the steps of:

successively forming a field oxide for isolating the devices, a gate, a source and drain region and a first oxide film which covers the gate on a semiconductor substrate;

successively depositing a first nitride film and a second oxide film;

removing said first nitride film and said second oxide film in the bit line contact region;

forming a first side wall of a polysilicon film;

successively depositing a bit line, an insulating film for leveling the surface and a second nitride film;

removing said bit line, said insulating film and said second nitride film at the portion which is except the bit line region; [?]

forming a second side wall of a nitride film in the sides of said bit line, said insulating film and said second nitride film:

removing said exposed second oxide film;

removing the exposed first and second nitride films and the second side wall;

forming a third side wall of an oxide film; and forming a capacitor consisting of a storage node, a dielectric film and a plate.

BRIEF DESCRIPTION OF THE INVENTION

The above and other objects and features of the present invention will be apparent from the following description of a preferred embodiment of the invention in conjunction with the accompanying drawings, in which.

DETAILED DESCRIPTION OF THE PREFERRED EMBODIMENT

A semiconductor memory device and a method for fabrication thereof, in which a bit line is aligned in the same direction as the word line according to the preferred embodiment of the present invention will be described in more detail with reference to the accompanying drawings.

Figure 3:
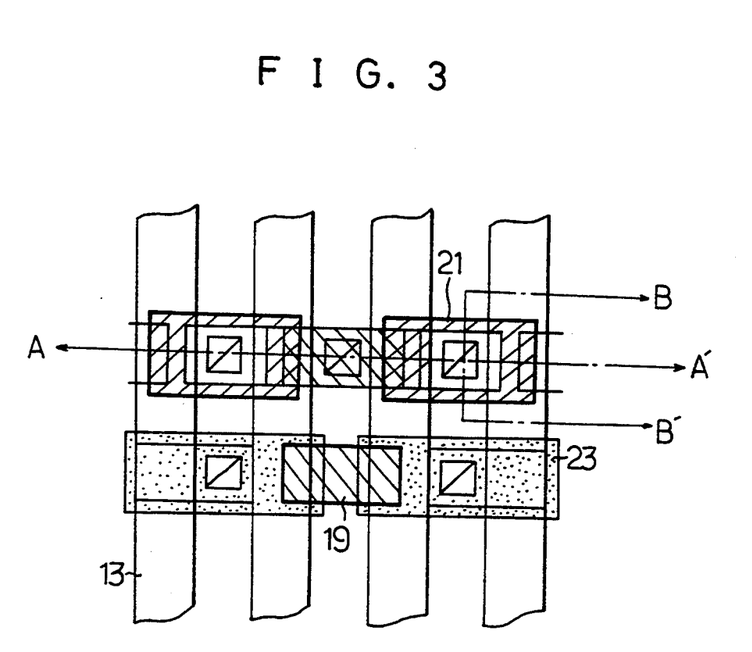
FIG. 3 is a lay-out of a semiconductor memory device in which a bit line and a storage node are overlapped according to a first preferred embodiment of the present invention.

FIG. 3 shows the lay-out of the semiconductor memory device in which a bit line and a storage node are overlapped according to the first embodiment of the present invention, and FIG. 4(a) through (f) are cross-sectional views of a fabrication process for the semiconductor memory device taken along section line A—A' of FIG. 3. FIGS. 5(a) through (f) are cross-sectional views of a fabrication process for the semiconductor memory device taken along section line B—B' of FIG. 3.

A method for fabricating the semiconductor memory device of the first embodiment of the present invention is described below with reference to FIG. 4 and FIG. 5.

Figure 4A:
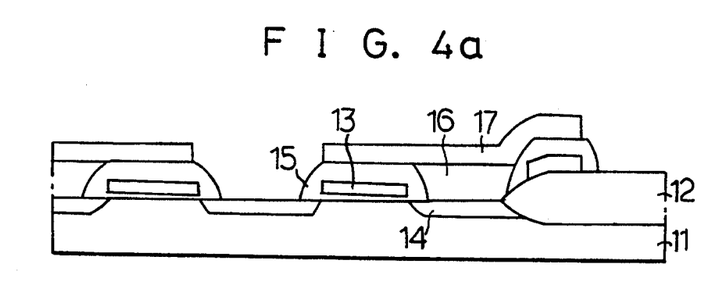
FIG. 4(a) through (f) are cross-sectional views of a fabrication process for a semiconductor memory device of the present invention taken along line A—A' of FIG. 3.
Figure 5A:
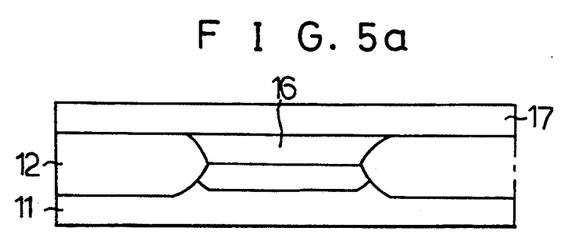
FIG. 5(a) through (f) are cross-sectional views of a fabrication process for a semiconductor memory device of the present invention taken along line B—B' of FIG. 3.

As shown in FIG. 4(a) and FIG. 5(a), a field oxide 12 for isolating the devices, a gate 13 used as the word line, the source and drain region 14 and a first oxide film 15 which covers the gate 13 are successively formed on the semiconductor substrate 11 and the doped polysilicon film 16 is filled in at the buried contact region by a deposition and etch back process. A second oxide film 17 is deposited on the whole surface and then said oxide film 17 is removed from the bit line contact region.

Figure 4B:
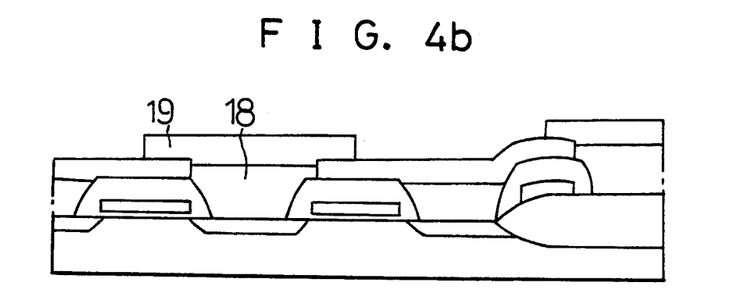
Figure 5B:
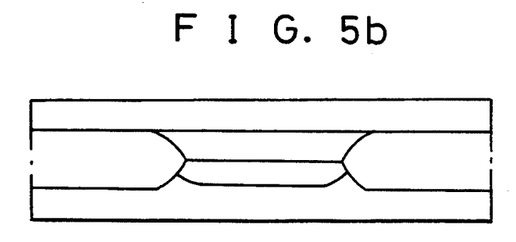

Henceforth, as shown in FIG. 4(b) and FIG. 5(b), the doped polysilicon film 18 is filled in the bit line contact region once more by an etch back process. A refractory metal film 19 is then deposited on the whole surface and the metal film 19 in the buried contact region is subsequently removed to form the bit line.

Figure 4C:
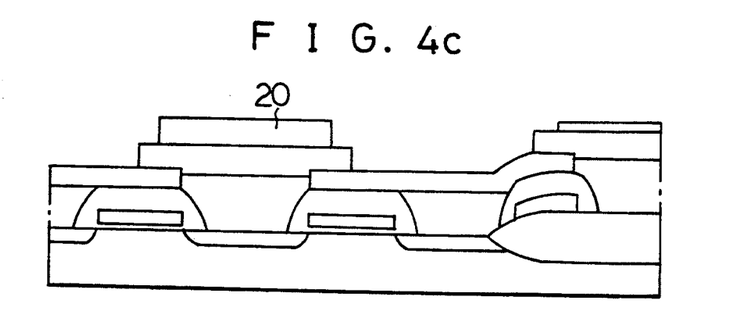
Figure 5C:
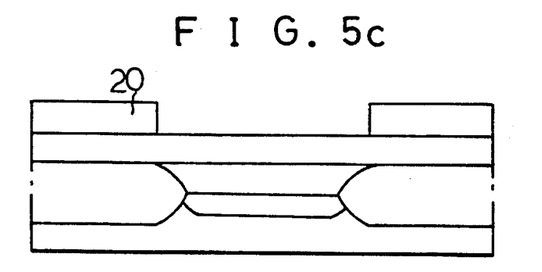

As shown in FIG. 4(c) and FIG. 5(c), an insulating film 20 for leveling the surface which is formed from boron phosphosilicate glass (BPSG) in the preferred embodiment shown is deposited on the whole and then removed except the range restricted within the width of the refractory metal film 19 by the etching process.

Figure 4D:
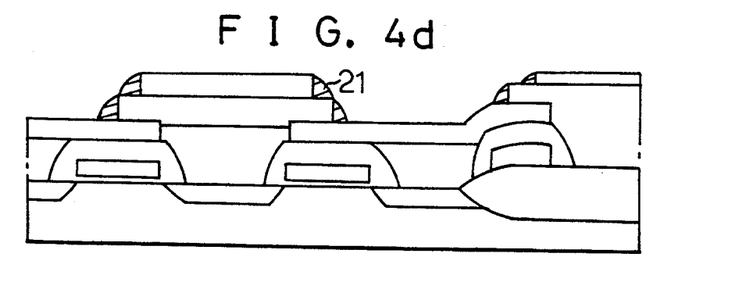
Figure 5D:
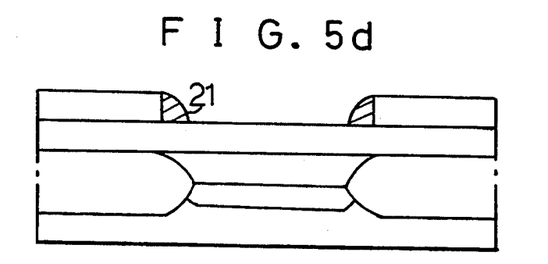

As shown in FIG. 4(d) and FIG. 5(d), a refractory metal layer 21 is deposited and then is etched back by an isotropic etching method to form a side wall (Hereinafter referred to as a bit line ring) at the side of said metal film 19 and the insulating film 20 for leveling the surface.

In the first embodiment, the bit line 19 is formed and the surface is leveled by using the insulating film 20 and then the bit line ring 21 is formed in order to overlap in the same direction the bit line 19 and a storage node to be formed according to the process set forth immediately below.

At this time, the bit line ring 21 of the refractory metal film 19 functions as the bit line and is formed at the upper stage of said bit line 19.

Figure 4E:
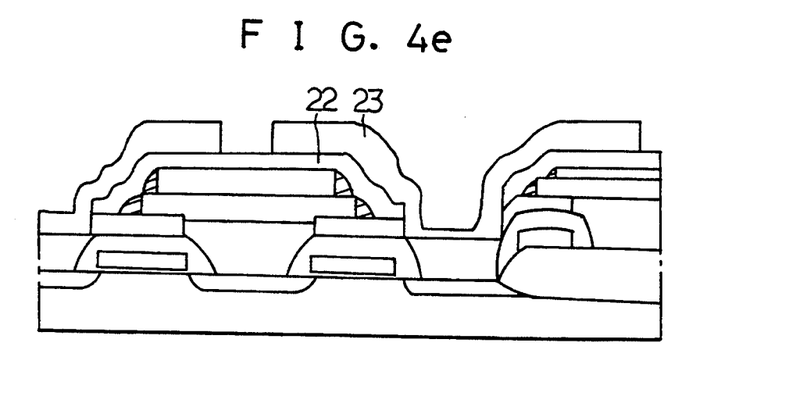
Figure 5E:
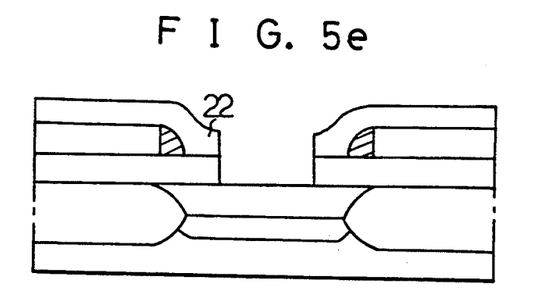

As shown in FIG. 4(e) and FIG. 5(e), an oxide film 22 is deposited on the whole surface and the oxide films 17 and 22 of the buried contact region are then removed.

Figure 4F:
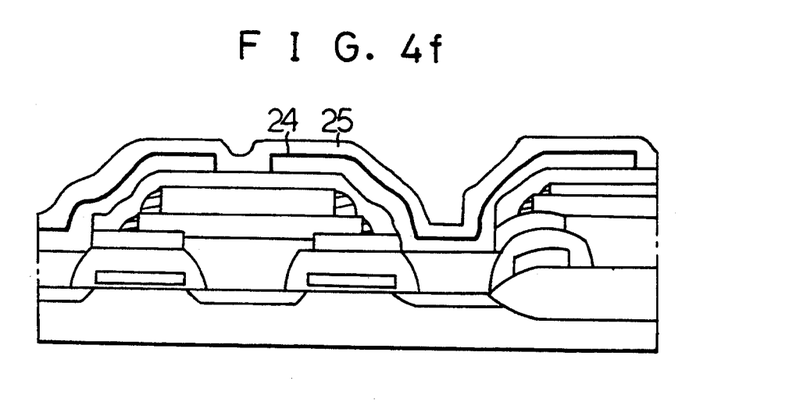
Figure 5F:
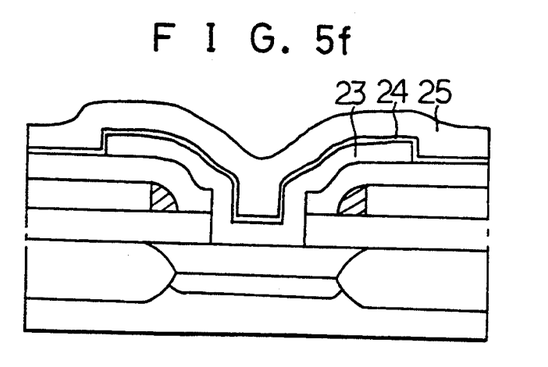

Finally, as shown in FIG. 4(f) and FIG. 5(f), a capacitor consisting of a storage node 23, a dielectric film 24 and a plate 25 is formed to complete the fabrication of a semiconductor memory device in which the bit line 19 and the storage node 23 are overlapped rather than offset with a bent active region, as in the prior art.

In the semiconductor memory device fabricated by the aforesaid method of the first preferred embodiment, as shown in FIG. 3, the bit line 19 is formed perpendicularly to the word line 13 and the storage node 23 is formed so as to be aligned in the same direction with the bit line ring 21 which functions as the bit line to be overlapped with said bit line 19 in a straight line.

In the above-mentioned semiconductor memory device in which the bit line 19 and the storage node 23 are overlapped in a straight line, the necessity for a bent region is not present. Therefore, the capacitor area is extended and the degree of integration can be improved.

Figure 6:
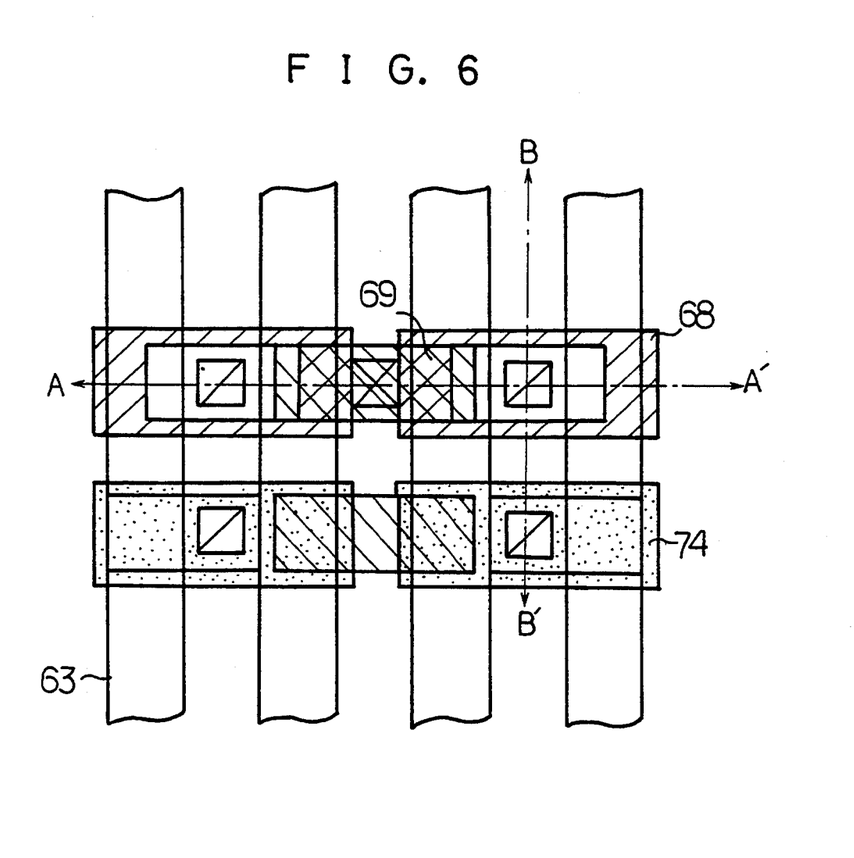
FIG. 6 is a lay-out of a semiconductor memory device in which a bit line and a storage node are overlapped according to a second preferred embodiment of the present invention.

FIG. 6 shows the lay-out of a semiconductor memory device in which the bit line is overlapped with a storage node according to the second embodiment of the present invention, and FIG. 7(a) through (i) are cross-sectional views of a fabrication process for the semiconductor memory device taken along line A—A' of FIG. 6 and FIG. 8(a) through (i) are cross-sectional views of a fabrication process for the semiconductor memory device taken along line B—B' of FIG. 6.

The method for fabricating the semiconductor memory device of the second embodiment of the present invention will be described with reference to the FIG. 7 and FIG. 8.

Figure 7A:
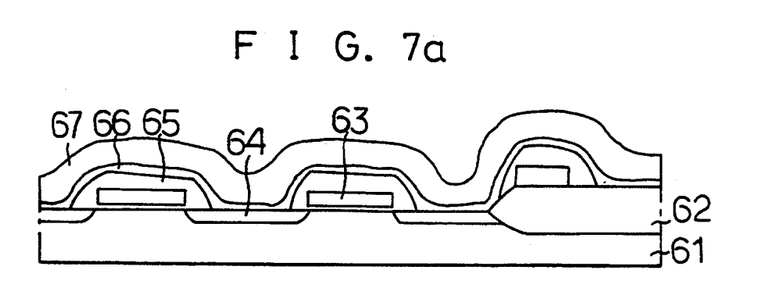
FIG. 7(a) through (i) are cross-sectional views of a fabrication process for a semiconductor memory device of the present invention taken along line A—A' of FIG. 6.
Figure 8A:
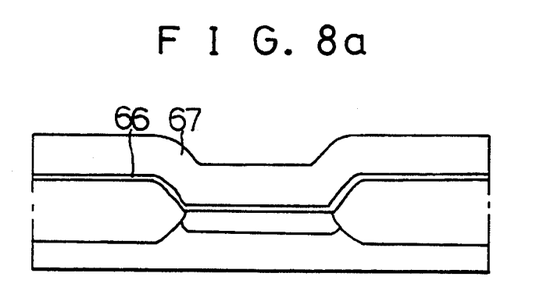
FIG. 8(a) through (i) are cross-sectional views of a fabrication process for a semiconductor memory device of the present invention taken along line B—B' of FIG. 6.

As shown in FIG. 7(a) and FIG. 8(a), a field oxide 62 for isolating the devices, the gate 63 used as the word line, the source and drain region 64 and a first oxide film 65 which cover the gate 63 are successively formed on the semiconductor substrate 61 and the nitride film 66 and the oxide film 67 are deposited on the whole surface of a semiconductor substrate 61.

Figure 7B:
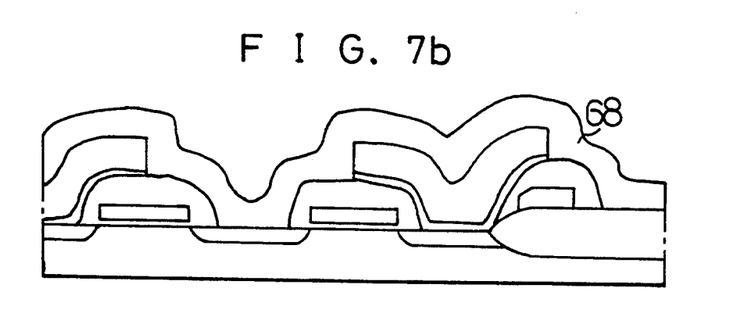
Figure 8B:
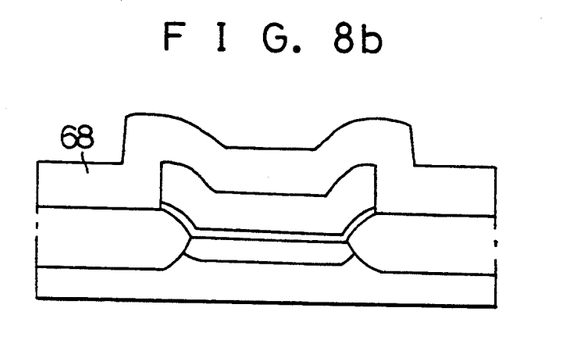

Henceforth, as shown in FIG. 7(b) and FIG. 8(b), said nitride film 66 and said oxide film 67 in the bit line contact region are removed and a polysilicon film 68 is deposited on the whole surface.

Figure 7C:
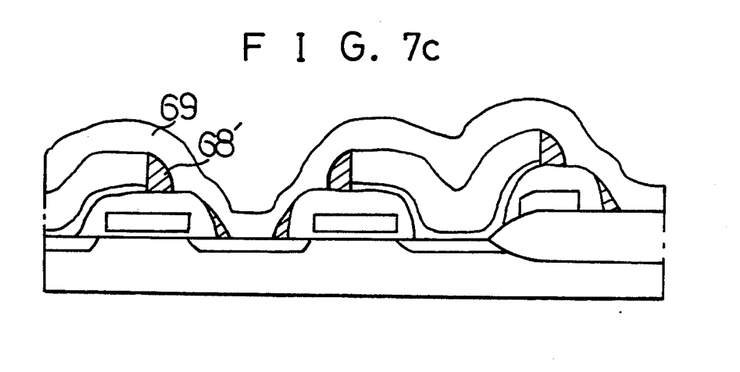
Figure 8C:
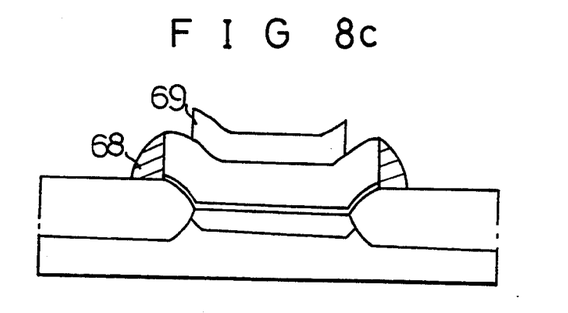

Then as shown in FIG. 7(c) and FIG. 8(c), said polysilicon film 68 is etched by an isotropic etching method to form a first side wall (bit line ring) in the side of said nitride film 66 and said oxide film 67 and the bit line 69 of the silicide or the refractory metal is formed.

Figure 7D:
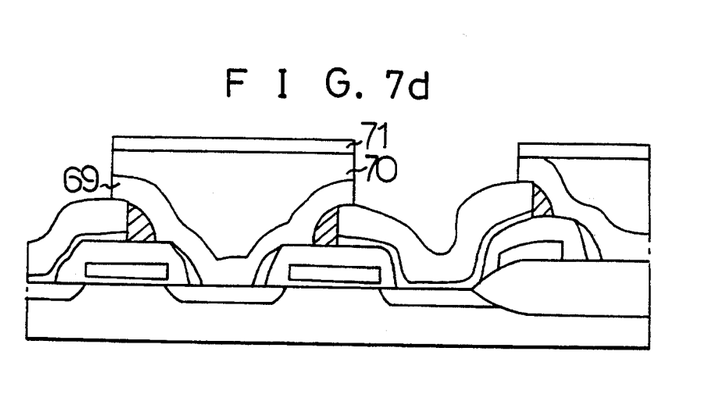
Figure 8D:
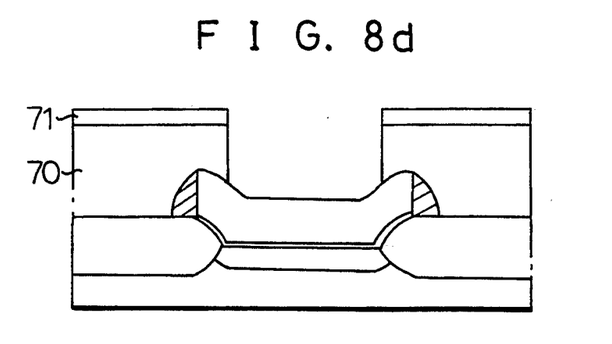

As shown in FIG. 7(d) and FIG. 8(d), an insulating film 70 for leveling the surface which may be formed of spin on glass(SOG) and polyimide or boron phosphosilicate glass (BPSG) and a second nitride film are deposited and then the nitride film 71, the insulating film 70 and the bit line 69 of a capacitor contact portion are removed.

At this time, the oxide film is capable of using for the insulating film 70 for leveling the surface.

Figure 7E:
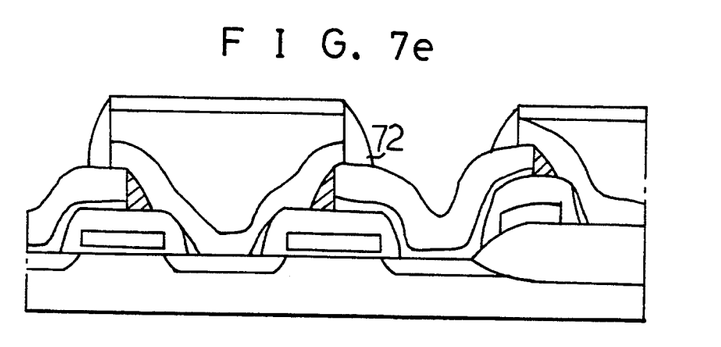
Figure 8E:
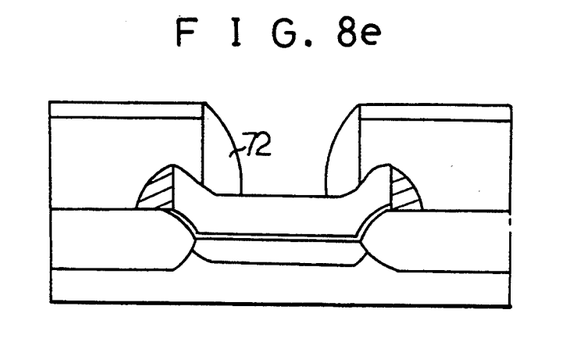

As shown in FIG. 7(e) and FIG. 8(e), a nitride film is deposited on the whole surface and etched by the isotropic method to form a second side wall 72 and at this time, said oxide film 67 is exposed.

Figure 7F:
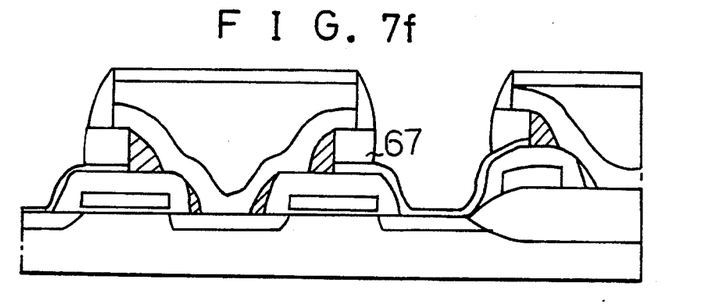
Figure 8F:
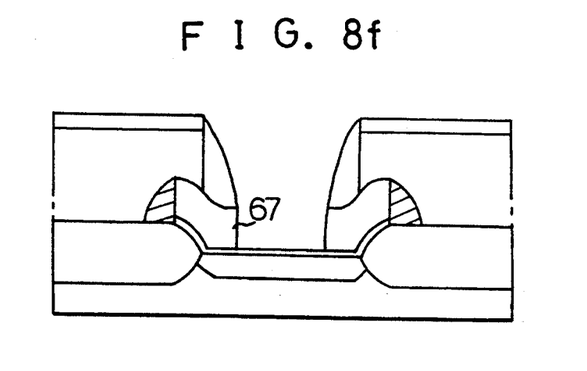

As shown in FIG. 7(f) and FIG. 8(f), said exposed oxide film 67 is removed by an isotropic etching method to expose the nitride film 66 of a capacitor contact portion.

Figure 7G:
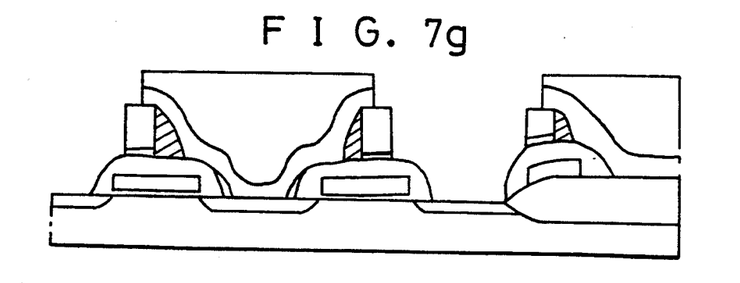
Figure 7H:
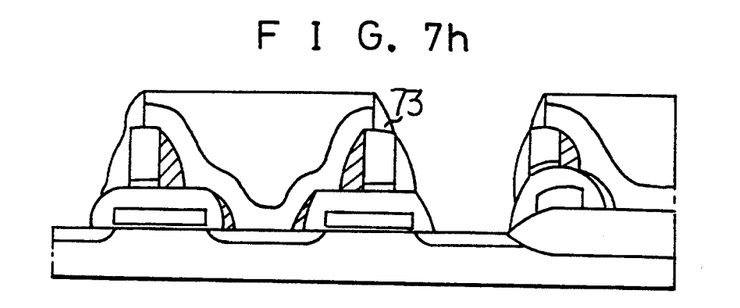
Figure 8G:
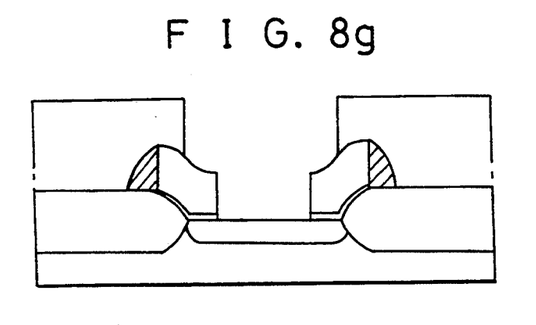
Figure 8H:
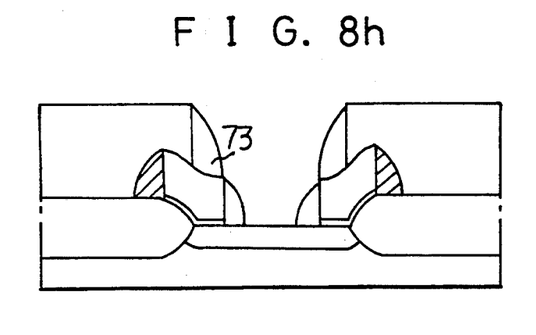

Henceforth, as shown in FIG. 7(g) and FIG. 8(g), the exposed nitride films 66 and 72 are removed and as shown in FIG. 7(h) and FIG. 8(h) the oxide film is deposited and then etched by an isotropic etching method to form the side wall 73.

Figure 7I:
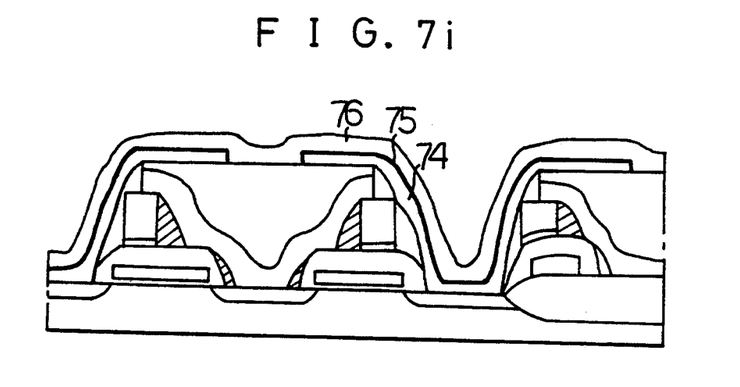
Figure 8I:
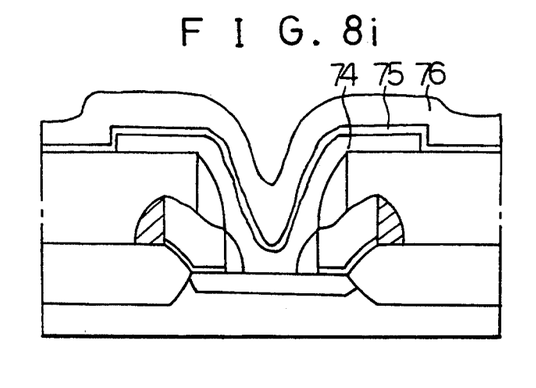

Finally, as shown in FIG. 7(i) and FIG. 8(i) the capacitor consisting of the storage node 73, a dielectric film 74 and a plate 75 is formed. Therefore, the semiconductor memory device in which the bit line 69 and the storage node 73 are overlapped is fabricated.

In the second embodiment, the bit line ring 68 and the bit line 69 are successively formed and the surface is levelled by using the insulating film 70 and therefore the bit line ring 68 is formed at the lower stage of the bit line 69.

In the semiconductor memory device fabricated by the aforesaid method, as shown in FIG. 6, the bit line 69 is formed perpendicularly to the word line 63 and the storage node 73 is formed in the same direction of the bit line ring 68 which functions as the bit line and is formed at the lower stage of the bit line 69 to be overlapped with said bit line 19 in a straight line.

In the above-mentioned semiconductor memory device in which the bit line 69 and the storage node 73 are overlapped in a straight line, the bent portion of the active region is avoided. Therefore, the capacitor area is extended and the integration degree can be improved.

According to the present invention, a storage node is overlapped on the bit line in a straight line in a capacitor contact portion. Therefore, a capacitor area can be increased without increase of an area of the unit cell to improve the integration degree of the semiconductor memory device and the generation of the bent portion of the active region can be prevented to decrease the distortion.

While there have been described what are, at present, considered to be preferred embodiments of the invention, it will be understood that various modifications may be made therein, and it is intended to cover in the appended claims all such modifications as fall within the true spirit and scope of the invention.

What is claimed is

1. A method for fabricating a semiconductor memory device, including:
   providing a substrate;
   forming a plurality of active regions on the substrate, each active region formed by successively forming a field oxide for isolating the active region from adjacent active regions, a gate, a laterally spaced source and drain region, and a first oxide film which covers the gate;
   filling a doped polysilicon film over each source region to form a source contact connection layer;
   forming a second oxide film over the gates and the source and drain regions;
   removing the second oxide film over the drain regions;
   filling a second doped polysilicon film over each drain region to form drain contact connection layers;
   forming a refractory metal bit line over each drain contact connection layer;
   forming an insulating film for leveling the surface over each bit line;
   forming a refractory metal side wall at each side of each bit line and insulating film for levelling the surfaces, the refractory metal of the bit lines and the refractory metal of the side walls being the same material;
   depositing a third oxide film over the whole surface;
   removing the second and third oxide films from over the source contact connection layers; and
   forming a capacitor above each source region, each capacitor including a storage node overlapping a corresponding bit line, a dielectric film and a plate.

2. The method of claim 1 wherein forming the refractory metal bit lines includes isotropically etching a refractory metal film to form the bit lines.

3. A method for fabricating a semiconductor memory device, including:
   providing a substrate;
   forming a plurality of active regions on the substrate, each active region formed by successively forming a field oxide for isolating the active region from adjacent active regions, a gate, a laterally spaced source and drain region, and a first oxide film which covers the gate;
   depositing a first nitride film over the active regions;
   depositing a second oxide film over the first nitride film;
   removing the second oxide film and first nitride film over the drain regions to form bit line contact regions;
   forming first side walls of polysilicon film on sides of the first nitride film and second oxide film at each bit line contact region;
   successively depositing over each active region a bit line, an insulating film for leveling the surface, and a second nitride film;
   removing portions of the bit lines, insulating film, and second nitride film from capacitor contact regions above each source region;
   forming second side walls of the nitride film on sides of the bit line, insulating film and second nitride film over the second oxide film;
   removing exposed portions of the second oxide film not covered by the second side walls;
   removing exposed portions of the first and second nitride films and the second side walls;
   forming a third side wall of an oxide film on sides of the bit line and insulating film; and
   forming a capacitor above each source region, each capacitor including a storage node overlapping a corresponding bit line, a dielectric film and a plate.

4. The method of claim 3 wherein depositing an insulating film for levelling the surface includes depositing an oxide film.

5. The method of claim 3 wherein depositing a bit line includes depositing a refractory metal bit line.

6. The method of claim 3 wherein depositing a bit line includes depositing a silicide bit line.

* * * * *